United States Patent
Shinmura

[11] Patent Number: 6,136,658
[45] Date of Patent: Oct. 24, 2000

[54] METHOD OF FABRICATING A SEMICONDUCTOR DEVICE INCLUDING A CONTACT HOLE BETWEEN GATE ELECTRODE STRUCTURES

[75] Inventor: Naoyuki Shinmura, Tenri, Japan

[73] Assignee: Sharp Kabushiki Kaisha, Osaka, Japan

[21] Appl. No.: 08/891,081

[22] Filed: Jul. 10, 1997

[30] Foreign Application Priority Data

Jul. 12, 1996 [JP] Japan ..................... 8-183409

[51] Int. Cl.[7] .............................................. H01L 21/336
[52] U.S. Cl. ..................... 438/305; 438/266; 438/299; 438/303
[58] Field of Search ................... 438/257, 263, 438/264, 265, 266, 303, 305, 436, 437, 533, 595, 675

[56] References Cited

U.S. PATENT DOCUMENTS 5,631,179  5/1997  Sung et al. ......................... 438/264
5,856,227  1/1999  Yu et al. ........................... 438/305

Primary Examiner—Charles Bowers
Assistant Examiner—Jack Chen
Attorney, Agent, or Firm—Nixon & Vanderhye, P.C.

[57] ABSTRACT

A method of fabricating a semiconductor device is provided which requires less distance allowance between gate electrodes and a contact hole, and which can therefore readily promote micro-fine patterning. A gate insulating film, conductive films to be used as material for gate electrodes, and a mask insulating film to be used as an etching mask are sequentially formed in stack on a surface of a semiconductor substrate. The mask insulating film and the conductive films are processed into a gate electrode pattern. An interlayer insulation film is deposited to fill a space between adjacent stacks of the mask insulating film and gate electrodes. The interlayer insulation film is selectively etched relative to the mask insulating film, thereby exposing sides of the mask insulating film. Side wall films are formed on the exposed portions of sides of the mask insulating film. The interlayer insulation film is selectively etched relative to the mask insulating film and side wall films, a contact hole being thereby formed.

12 Claims, 14 Drawing Sheets

METHOD OF FABRICATING A SEMICONDUCTOR DEVICE INCLUDING A CONTACT HOLE BETWEEN GATE ELECTRODE STRUCTURES

BACKGROUND OF THE INVENTION

The present invention relates to a method of fabricating a semiconductor device. More particularly, the invention relates to a semiconductor device fabricating method wherein an interlayer insulation film is formed on a diffusion region between gate electrodes which constitute a MOS (metal oxide semiconductor) transistor and a contact hole is formed in the interlayer insulation film in self-aligned relation to the gate electrodes.

Hitherto, there has been known a method as defined by the steps shown in FIGS. 4A through 4G for forming a contact hole on a source or drain region between gate electrodes constituting a MOS transistor in self-aligned relation to the gate electrodes. It is noted that in this example the MOS transistor is an N-channel type MOS transistor having an LDD (lightly doped drain) structure.

As FIG. 4A shows, on a p-type silicon substrate (in an active region thereof) 41 having an isolation region (not shown) formed therein by LOCOS (local oxidation) technique, for example, is first formed a film of silicon oxide 42 as a gate insulating film by thermal oxidation, and a polycrystal silicon film 43 and a tungsten silicide film 44 which are to be used as gate electrode materials are sequentially deposited by a CVD (chemical vapor deposition) method over the silicon oxide 42, then a silicon oxide film 45 is formed over the tungsten silicide 44 by the CVD method.

Subsequently, a photolithographic step is carried out to provide a resist (not shown) in a region to be formed into a gate of the MOS transistor, and reactive ion etching is carried out using the resist as a mask to remove silicon oxide 45, tungsten silicide 44, and polycrystal silicon 43. As a result, gate electrodes G comprised of tungsten silicide 44 and polycrystal silicon 43 are formed as such. After removal of the resist, ion implantation is carried out utilizing the silicon oxide 45 and gate electrodes G as masks to form an N-type low-density diffusion layer 46 which is to act as an LDD region.

Next, after a silicon oxide film 47 is deposited over the entire surface as shown in FIG. 4B, anisotropic etching back is carried out to form a side wall film comprised of a silicon oxide film 47 on both sides of silicon oxide film 45 and gate electrode G as shown in FIG. 4C. Then, ion implantation is carried out using the side wall film 47, silicon oxide 45, and gate electrodes G as masks to form an N-type high density diffusion layer 48 which is to act as a source or drain region (LDD structure).

Next, as FIG. 4D shows, a silicon nitride film 49 and a silicon oxide film 50 are sequentially deposited on the entire surface as interlayer insulation films for electrically isolating the gate electrodes G from an overlying wiring arrangement not shown. The silicon oxide 50 is deposited comparatively thick so that it may have a planar surface configuration. Generally, such flat surface formation of the interlayer insulation films is required for the purpose of facilitating the patterning of the overlying wiring arrangement. The reason why the silicon nitride film 49 is deposited prior to the deposition of the silicon oxide film 50 is that if the silicon oxide film 50 only is deposited, there is a fear that at a later stage of contact hole opening, the silicon oxide 45 may also be etched so that the gate electrode G is exposed. Therefore, the silicon nitride 49, as insulating material which can be selectively etched relative to the silicon oxide, is deposited as stated above before the silicon oxide 50 is deposited as such.

Next, as FIG. 4E shows, a photolithographic operation is carried out to form a resist R having an opening 51 on the silicon oxide film 50 for use as a mask for forming a contact hole. The size of the opening 51 of the resist R (dimensions within planes parallel to the substrate) contains opposed side walls 47, 47 of adjacent gate electrodes G, G and also contains part of the gate electrodes G by way of allowance. Subsequently, etching is carried out using the resist R as a mask to remove silicon oxide 50 selectively relative to the silicon nitride film 49, that is, under such conditions as will make the silicon nitride 49 not liable to be etched. As a result, a portion $H_1$ of a contact hole is formed. In this case, etching stops on the surface of the silicon nitride film 49.

Then, as FIG. 4F shows, the silicon nitride 49 exposed within the opening 51 of the resist R is selectively etched off in relation to the silicon oxide. In this case, side wall films 49a, 49a composed of silicon nitride remain unremoved on opposed sides of the side wall films 47, 47. If an attempt is made to remove such side wall film 49a, the time period of etching is prolonged and this may cause damage to the silicon substrate. Therefore, the time period of etching is set to a time period of the order of slightly more than the time required in etching off the silicon nitride 49 throughout its deposited thickness.

Next, as FIG. 4G shows, the silicon oxide film 42 remaining on a source/drain region between the opposed side wall films 49a, 49a is etched off. In this way, a lower portion $H_2$ of contact hole H is formed in a self-aligned manner between the opposed side wall films 49a, 49a, whereby the contact hole H is formed which extends from the surface side of the interlayer insulation film 50 to the surface of the source/drain region 48.

However, according to this fabricating method, the lower portion $H_2$ of contact hole H is formed in a region corresponding to the space between the opposed side wall films 49a, 49a. Therefore, in order to secure necessary area for the contact hole $H_2$, it is necessary that the distance between adjacent gate electrodes G, G be preset relatively large, at the stage of pattern designing, allowing for the thickness (shown widthwise) of side wall films 49a, 49a in addition to the thickness (shown widthwise) of the side wall films 47, 47. This poses a problem that where a semiconductor integrated circuit having a plurality of such MOS transistors arranged on a semiconductor substrate is to be constructed, micro-fine patterning is hindered.

Where the MOS transistor is a non-volatile memory transistor having a floating gate, there is known a fabricating method as illustrated in FIGS. 5A through 5F.

First, as FIG. 5A shows, on a p-type silicon substrate (in an active region thereof) 61 having an isolation region (not shown) formed therein by LOCOS (local oxidation) technique, for example, is formed a silicon oxide film 62 as a first gate insulating film by thermal oxidation, and a film of polycrystal silicon 63 to be used as material for floating gate electrodes is deposited over the silicon oxide film 62. Then, a photolithographic step is carried out to provide a resist (not shown) in a region to be formed into a floating gate, and reactive ion etching is carried out using the resist as a mask to remove polycrystal silicon 63. It is noted that at this stage the remaining polycrystal silicon 63 occupies a larger area than shown.

Thereafter, on the remaining polycrystal silicon film 63 is formed an ONO film (a three-layer film consisting of silicon oxide film/silicon nitride film/silicon oxide film) 64 which is to serve as a second gate insulating film, and then a polycrystal silicon film 65 and a tungsten silicide film 66 which are to be used as material of a control gate electrode are sequentially deposited by the CVD technique over the ONO film (it is to be noted in this connection that in some case a silicon oxide film may be deposited over the tungsten silicide 66).

Subsequently, a photolithographic step is carried out to provide a resist (not shown) in a region to be formed into a control gate, and reactive ion etching is carried out using the resist as a mask to sequentially etch off tungsten silicide 66, polycrystal silicon 65. ONO film 64, and polycrystal silicon 63. As a result, a control gate electrode CG and a floating gate electrode FG are formed in same region.

Then, after removal of the resist, ion implantation is carried out using the control electrode CG, etc. as masks thereby to form an N-type high density diffusion layer 67 which is to be formed into a source or drain region.

Next, as FIG. 5B shows, thermal oxidation is carried out in an oxygen atmosphere to form a silicon oxide film 68a on sides of the polycrystal silicon film 63 which constitutes a floating gate electrode FG, the silicon oxide film 68a having comparatively good electric insulation characteristic. The reason for forming the silicon oxide film 68a is that in a non-volatile memory transistor having a floating gate, wherein the state of the memory transistor as a memory element in writing and erasing is defined by the quantity of charge accumulated in the floating gate electrode FG, it is necessary to improve the insulating characteristic of the floating gate electrode FG. It is noted in the above connection that simultaneously with the formation of the silicon oxide film 68a on sides of the floating gate electrode FG are formed a silicon oxide film 68b on sides of the polycrystal silicon 65 which is a constituent of the control gate electrode CG, and silicon oxide films 68c and 68d respectively on sides and top of the tungsten silicide 66. The surface side of the source/drain region 67 is oxidated and a silicon oxide film 68e is formed thereon in place of the first gate insulating film 62. For example, where the thickness d1 of the silicon oxide film 68a is set to 50 nm for enabling the floating gate electrode FG to have good insulating property, the thickness d2 of the silicon oxide film 68b is 50 nm, the thickness d3, d4 of the silicon oxide films 68c, 68d is 80 nm, and the thickness d5 of the silicon oxide film 68e is 100 nm. The reason for d1<d5 is that the quantity of impurities injected into the source/drain region 67 is larger than the quantity of impurities injected into the floating gate electrode FG. When the polycrystal silicon film is oxidated, the position of the film surface (an interface relative to the silicon oxide film) is changed, whereas no changes occur in the surface position when the tungsten silicide is oxidated. Therefore, the upper portion 66 of the control gate electrode CG is larger in width than the lower portion 65 thereof. Furthermore, the thickness d3 of the silicon oxide film 68c is larger than the thickness d1, d2 of the silicon oxide films 68a, 68b. Therefore, the silicon oxide films 68a, 68b, 68c have an overhang configuration.

Next, as FIG. 5C shows, a silicon nitride film 69 and a silicon oxide film 70 are sequentially deposited on the entire surface as interlayer insulation films for electrically isolating the gate electrodes G from the overlying wiring arrangement not shown. The silicon oxide film 70 is deposited comparatively thick so that it may have a planar surface configuration. The silicon nitride film 69 is deposited as insulating material which can be selectively etched relative to the silicon oxide.

Next, as FIG. 5D shows, a photolithographic operation is carried out to form a resist R having an opening 71 on the silicon oxide film 70 for use as a mask for forming a contact hole. Then, etching is carried out using the resist R as a mask to remove silicon oxide film 70 selectively relative to the silicon nitride 69, that is, under such conditions as will make the silicon nitride 69 not liable to be etched. As a result, a portion $H_1$ of a contact hole is formed. In this case, etching stops on the surface of the silicon nitride film 69. However, a portion 70a of the silicon oxide film 70 remains unremoved under a shade (recess) produced in the silicon nitride film 69 due to the overhang configuration of the silicon oxide films 68a, 68b, 68c.

Then, as FIG. 5E shows, the silicon nitride film 69 exposed within the opening 71 of the resist R is selectively etched off in relation to the silicon oxide film. In this case, a side wall film 69a composed of silicon nitride remains unremoved between the silicon oxide film 68 (and ONO film 64) and the portion 70a of silicon oxide.

Next, as FIG. 5F shows, the silicon oxide film 68 remaining on a source/drain region between the opposed side wall films 69a, 69a is etched off. In this way, a lower portion $H_2$ of contact hole H is formed in a self-aligned manner between the opposed side wall films 69a, 69a, whereby a contact hole H is formed which extends from the surface side of the interlayer insulation film 70 to the surface of the source/drain region 67.

However, according to this fabricating method, as is the case with the fabrication of a MOS transistor having an LDD structure, the lower portion $H_2$ of contact hole H is formed in the space between the opposed side wall films 69a, 69a. Therefore, in order to secure necessary area for the contact hole $H_2$, it is necessary that the distance between adjacent control gate electrodes CG and CG be preset relatively large, at the stage of pattern designing, allowing for the thickness (shown widthwise) of side wall films 69a, 69a in addition to the thickness of the silicon oxide film 68. This poses a problem that where a semiconductor integrated circuit having a plurality of such non-volatile memory transistors arranged on a semiconductor substrate is to be constructed, micro-fine patterning is hindered. Another problem is that at the stage of forming the lower portion $H_2$ of the contact hole H, that is, at the time of etching off the silicon oxide film 68e (of thickness d5) on the source/drain region 67, the silicon oxide film 68c (of thickness d3<d5) covering the side of the tungsten silicide film 66 is also partly etched off. As a result, the tungsten silicide film 66 is exposed within the contact hole H, and this involves the danger of short-circuiting between the overlying wiring and the control gate electrode CG.

SUMMARY OF THE INVENTION

Therefore, it is an object of the present invention to provide a method of fabricating a semiconductor device which requires less distance allowance between gate electrodes and a contact hole, and which can therefore readily promote micro-fine patterning.

It is another object of the invention to provide a method of fabricating a semiconductor device which involves no possibility of the gate electrode material being exposed within the contact hole, and which involves no possibility of short-circuiting between the overlying wiring and the gate electrode.

In order to achieve the aforementioned objects, the invention presents a method of fabricating a semiconductor device wherein a contact hole is formed in self-aligned relation to gate electrodes, the method comprising:

forming on a surface of a semiconductor substrate a gate insulating film, an electroconductive film which is to be used as material for gate electrodes, and a mask insulating film which is to be used as material for an etching mask, by sequentially placing them one over another;

separating each of the mask insulating film and the electroconductive film on the semiconductor substrate respectively to process the electroconductive film into a gate electrode pattern such that the gate electrodes are arranged in plurality, thereby forming the gate electrodes comprised of the electroconductive film;

depositing on the semiconductor substrate an interlayer insulation film comprised of a material which is selectively etched in relation to the mask insulating film, thereby filling a space between adjacent stacks of the mask insulating film and the gate electrode with the interlayer insulation film;

selectively etching the interlayer insulation film in relation to the mask insulating film to lower a surface level of the interlayer insulation film, thereby exposing sides of the mask insulating film at least in part;

forming a side wall film comprised of a material to which the interlayer insulation film is selectively etched on the exposed portions of sides of the mask insulating film; and selectively etching the interlayer insulation film in relation to the mask insulating film and the side wall films to remove a portion of the interlayer insulation film which corresponds to a space between the opposed side wall films, thereby forming the contact hole extending to a diffusion region formed on the surface of the semiconductor substrate.

According to the method of fabricating a semiconductor device of the present invention, the contact hole is formed by selectively etching the interlayer insulation film in relation to the mask insulating film and the side wall film so that the contact hole is formed in self-aligned relation to the gate electrodes. Furthermore, the size of the contact hole is such that it is reduced only by a portion corresponding to the thickness of the opposed side wall films in relation to the distance between adjacent gate electrodes. It is only required, therefore, that less allowance be considered with respect to the distance between the gate electrodes and the contact hole as compared with the allowance required in the prior art. This facilitates the realization of a micro-fine patterning.

An embodiment of the invention further comprises, after formation of the gate electrodes and before deposition of the interlayer insulation film:

carrying out ion implantation using the mask insulating film and the gate electrodes as masks to form a low density diffusion region in a region corresponding to a space between the gate electrodes adjacent to one another on the semiconductor substrate;

forming side wall films on sides of the gate electrodes; and carrying out ion implantation using the mask insulating film, the gate electrodes, and the side wall films as masks to form a high density diffusion region in a region corresponding to an interior side of the low density diffusion region as viewed in a direction parallel to the surface of the semiconductor substrate.

In the semiconductor device fabricating method of this embodiment, when fabricating a MOS transistor having an LDD structure, the contact hole is formed in self-aligned relation to the gate electrodes. Further, the size of the contact hole is such that it is reduced only by a portion corresponding to the thickness of the opposed side wall films in relation to the distance between adjacent gate electrodes. It is only required, therefore, that less allowance be considered with respect to the distance between the gate electrodes and the contact hole as compared with the allowance required in the prior art. This facilitates the realization of a micro-fine patterning.

The invention also presents a method of fabricating a semiconductor device wherein a contact hole is formed in self-aligned relation to gate electrodes, the method comprising:

forming on a surface of a semiconductor substrate a first gate insulating film, a first electroconductive film which is to be used as material for floating gate electrodes, a second gate insulating film, a second electroconductive film which is to be used as material for control gate electrodes, and a mask insulating film which is to be used as material for an etching mask, by sequentially placing them one over another;

separating each of the mask insulating film, the second electroconductive film, the second gate insulating film, the first electroconductive film, and the first gate insulating film on the semiconductor substrate respectively to process them into a gate electrode pattern such that the gate electrodes are arranged in plurality, thereby forming the floating gate electrodes comprised of the first electroconductive film and the control gate electrodes comprised of the second electroconductive film;

carrying out ion implantation using at least the mask insulating film as a mask to form a diffusion region in a region corresponding to a space between the gate electrodes adjacent to one another on the surface of the semiconductor substrate;

forming thermal oxide films by thermal oxidation on respective sides of the floating gate electrodes and the control gate electrodes;

depositing on the semiconductor substrate an interlayer insulation film comprised of a material which is selectively etched in relation to the mask insulating film, thereby filling a space between adjacent stacks of the mask insulating film, the control gate electrodes, the second gate insulating film, and the floating gate electrodes with the interlayer insulation film;

selectively etching the interlayer insulation film in relation to the mask insulating film to lower a surface level of the interlayer insulation film, thereby exposing sides of the mask insulating film at least in part;

forming a side wall film comprised of a material to which the interlayer insulation film can be selectively etched on the exposed portions of sides of the mask insulating film; and selectively etching the interlayer insulation film in relation to the mask insulating film and the side wall films to remove a portion of the interlayer insulation film which corresponds to a space between the opposed side wall films, thereby forming the contact hole extending to the diffusion region.

According to the above described method of fabricating the semiconductor device of the present invention, when fabricating a semiconductor memory transistor having a floating gate, the contact hole is formed by selectively etching the interlayer insulation film relative to the mask insulating film and the side wall films so that the contact hole is formed in self-aligned relation to the gate electrodes (floating gate electrode and control gate electrode). Further, the size of the contact hole is such that it is reduced only by a portion corresponding to the thickness of the opposed side wall films in relation to the distance between adjacent gate electrodes. Thus, it is only required that less allowance be considered with respect to the distance between the gate electrodes and the contact hole as compared with the allowance required in the prior art. This facilitates the realization of a micro-fine patterning. Furthermore, the method involves no possibility of the gate electrode material being exposed within the contact hole, and there is no possibility either short-circuit between the overlying wiring and the gate electrodes.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will now be described in detail.

(First Embodiment)

Referring to FIGS. 1A through 1H, there is shown an embodiment wherein on a source or drain region between gate electrodes constituting a MOS transistor is formed a wiring contact in self-aligned relation to the gate electrodes. In this embodiment, the MOS transistor is an N-channel type MOS transistor having an LDD (lightly doped drain) structure.

Figure 1A:
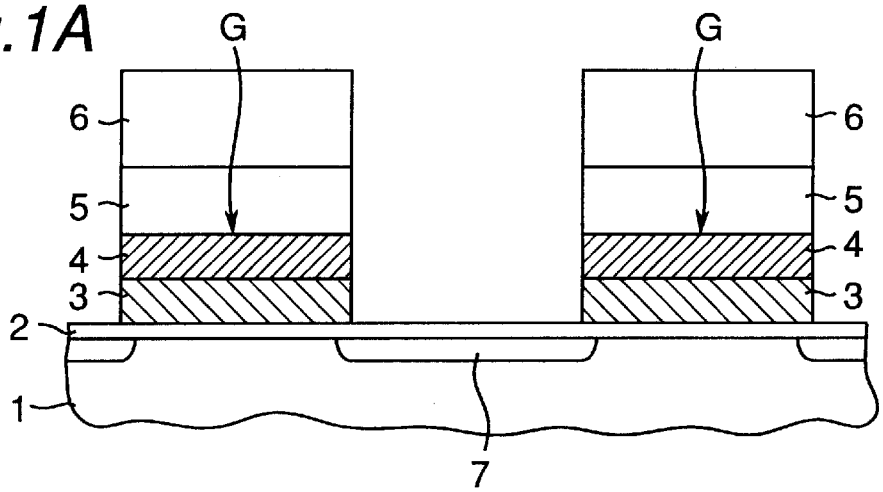
FIGS. 1A through 1H are step by step diagrams for explaining a fabricating method which represents a first embodiment of the invention as applied in fabricating an MOS transistor having an LDD structure.

First, as FIG. 1A shows, on a p-type silicon substrate (in an active region thereof) 1 having an isolation region (not shown) formed therein by the LOCOS (local oxidation) technique, for example, is formed a silicon oxide film 2 of 10 nm in thickness as a gate insulating film by thermal oxidation, and polycide films 3 and 4 to be made into gate electrode material are sequentially deposited one over the other by the CVD (chemical vapor deposition) technique, and then a silicon oxide film 5 of 150 nm in thickness and a silicon nitride film 6 of 200 nm in thickness which acts as a mask insulating film are sequentially deposited by the CVD technique over the polycide film 4. The polycide films are a polycrystal silicon film 3 of 100 nm in thickness and a tungsten silicide film 4 of 100 nm in thickness, the polycrystal silicon film 3 being doped with phosphorus as an impurity.

Subsequently, a photolithographic step is carried out to provide a resist (not shown) in a region to be formed into a gate of the MOS transistor, and reactive ion etching is carried out using the resist as a mask to remove silicon nitride film 6, silicon oxide film 5, tungsten silicide film 4, and polycrystal silicon film 3. As a result, gate electrodes G comprised of tungsten silicide film 4 and polycrystal silicon film 3 are formed as such. After removal of the resist, phosphorus ion implantation is carried out at a dose of $5 \times 10^{13}/cm^2$ utilizing the silicon nitride film 6, silicon oxide film 5, and gate electrode G as masks to form an N-type low-density diffusion layer 7 which is to be an LDD region.

Figure 1B:
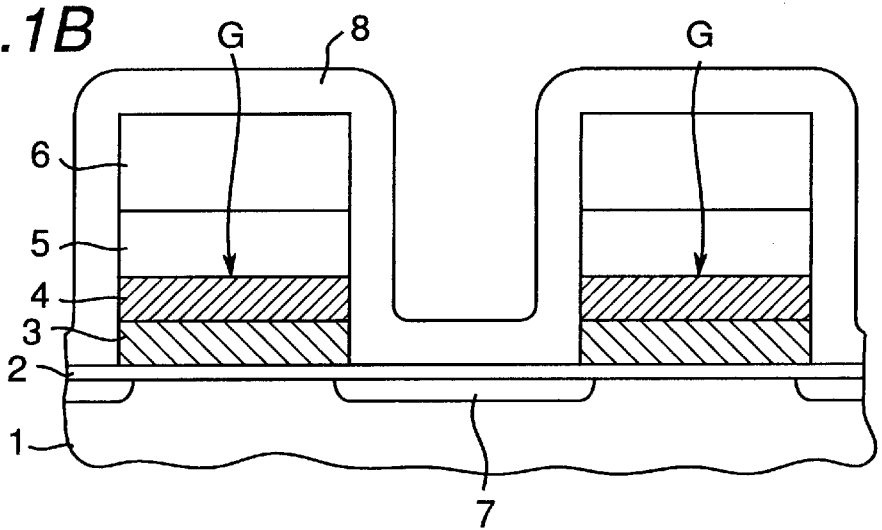
Figure 1C:
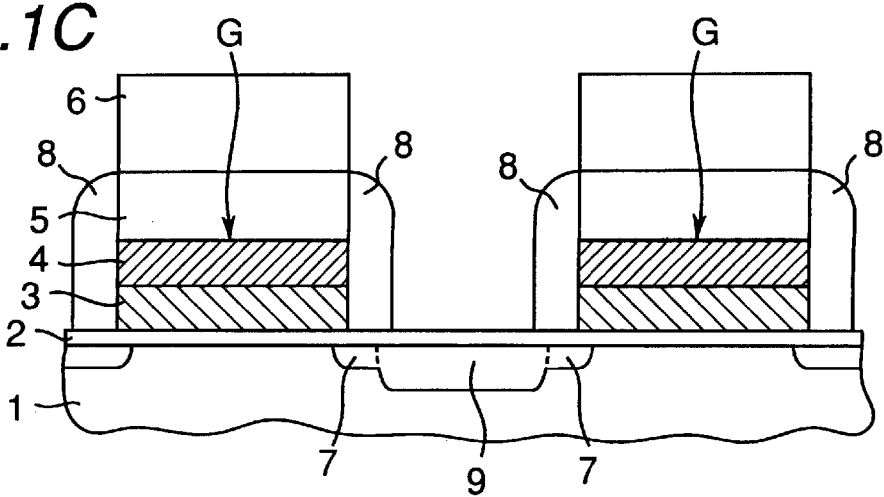

Next, after a silicon oxide film 8 is deposited over the entire surface as shown in FIG. 1B, anisotropic etching back is carried out to form a side wall film comprised of silicon oxide film 8 on both sides of silicon oxide film 5 and gate electrode G as shown in FIG. 1C (the side wall film to be designated by the same reference numeral as the silicon oxide film 8 for simplicity). Then, arsenic ion implantation is carried out at a dose of $1 \times 10^{15}/cm^2$ using the side wall film 8, silicon nitride film 6, silicon oxide film 5, and gate electrode G as masks to form an N-type high density diffusion layer 9 which is to act as a source or drain region (LDD structure).

Figure 1D:
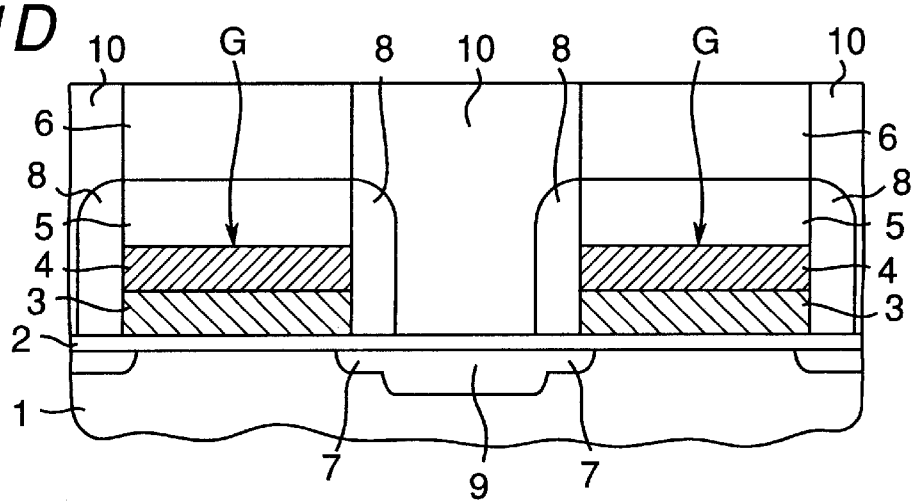

Next, as FIG. 1D shows, a silicon oxide film 10 of 1000 nm in thickness is deposited over the entire surface as an interlayer insulation film for electrically isolating the gate electrodes G from an overlying wiring not shown, thereby filling the space between adjacent gate patterns G, G with the silicon oxide. Then, the silicon oxide film 10 is polished to the surface level of the silicon nitride film 6 by a so-called CMP method (chemical mechanical polishing method).

Figure 1E:
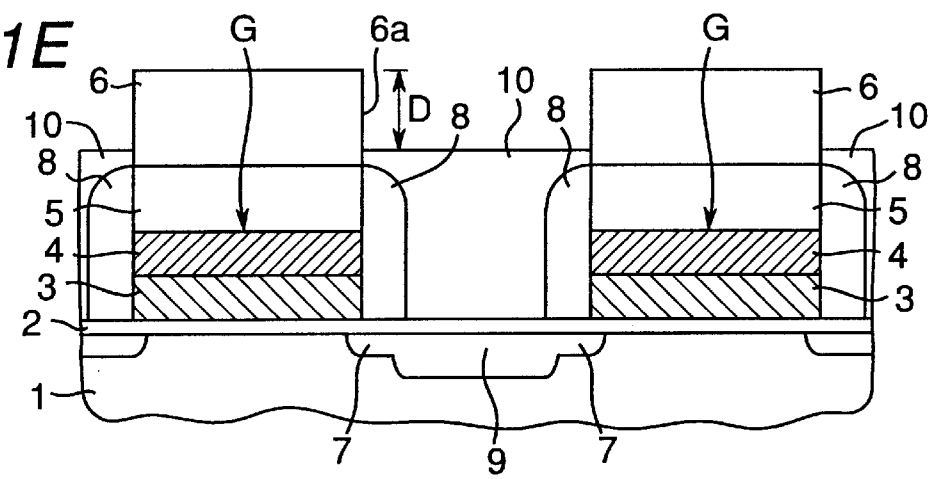

Then, the silicon oxide film 10 is selectively etched in relation to the silicon nitride film 6 thereby to lower the surface level of the silicon oxide film 10, thus exposing an upper portion of a side 6a of the silicon nitride film 6, as shown in FIG. 1E. A side wall film 11 of 100 nm in thickness which is comprised of silicon nitride is formed on the exposed portion of the side 6a at a next stage. Generally, for the formation of a side wall film, a step higher than the thickness of the side wall film is required and, therefore, in the present instance the height D of the exposed portion of the side 6a is set at 175 nm.

Figure 1F:
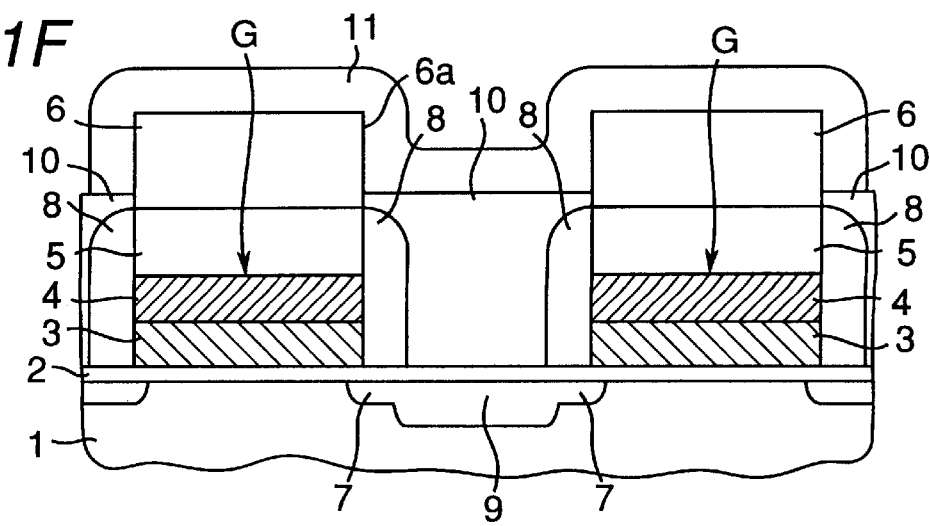
Figure 1G:
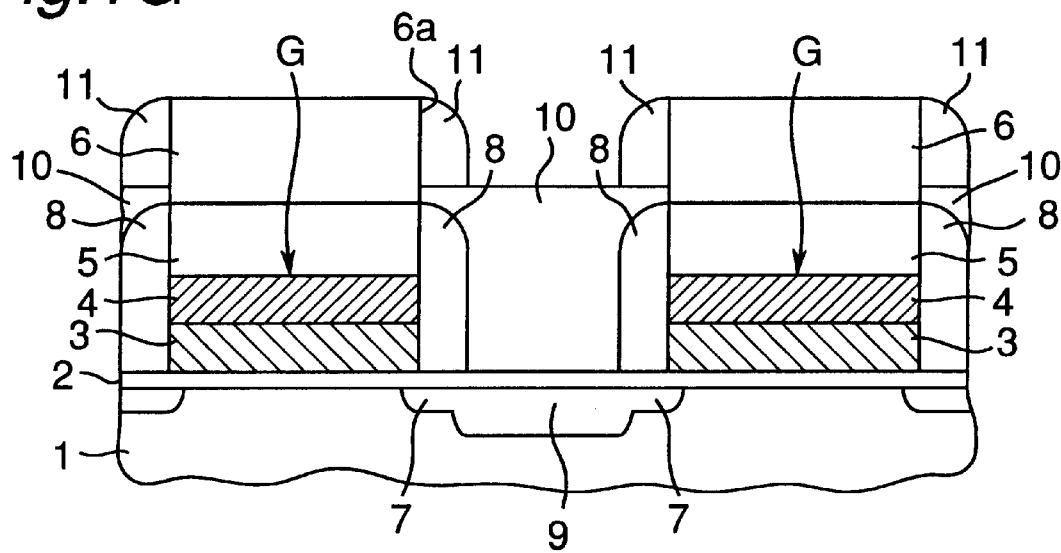

Next, as shown in FIG. 1F, after a silicon nitride film 11 is deposited to the thickness of 100 nm by using the CVD method over the entire surface, anisotropic etch back is carried out to form a side wall film (for simplicity, to be designated hereinafter by the same reference numeral as silicon nitride film 11) comprised of silicon nitride on the exposed portion of the side 6a of the silicon nitride film 6 as shown in FIG. 1G. The side wall film 11 is intended to electrically insulate the gate electrodes G from the overlying wiring not shown and is set to the thickness of 100 nm (shown widthwise) as earlier mentioned.

Figure 1H:
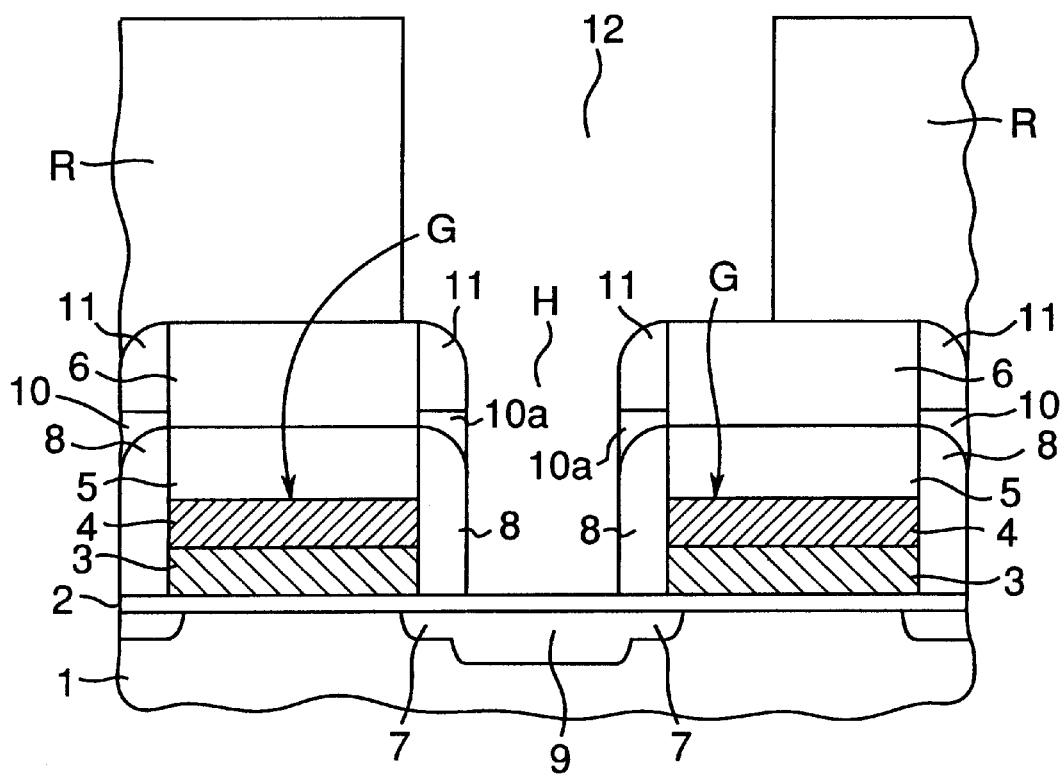

Next, as FIG. 1H shows, a photolithographic step is carried out to form a resist R having an opening 12 on the silicon nitride films 6 and 11 for use as a mask for forming a contact hole. The size of the opening 12 of the resist R (dimensions within planes parallel to the substrate) contains opposed side walls 8, 8 of adjacent gate electrodes G, G and also contains part of the gate electrodes G by way of allowance.

Subsequently, etching is carried out using the resist R, silicon nitride film 6, and side wall films 11 as masks to selectively remove most part of silicon oxide film 10, and further the silicon oxide film 2 above the source/drain region 9 is etched off. A portion 10a of the silicon oxide film 10 remains unremoved between the upper and lower side wall films 11 and 8. In this way, a contact hole H is formed in a self-aligned manner in a region corresponding to a space between the opposed side wall films 11 and 11. The contact hole H extends from the surface side of the interlayer insulation film 10 to the surface of the source/drain region 9.

Thus, the size of the contact hole H is such that it is reduced only by a portion corresponding to the thickness of the opposed side wall films 11, 11 in relation to the distance between adjacent gate electrodes G, G. Therefore, the allowance for the distance between the gate electrodes G and the contact hole H can be reduced as compared with the allowance required in the prior art. This facilitates the realization of a micro-fine patterning.

(Second Embodiment)

Referring to FIGS. 2A through 2G, there is shown a second embodiment wherein a MOS transistor is a nonvolatile memory transistor having floating gates.

Figure 2A:
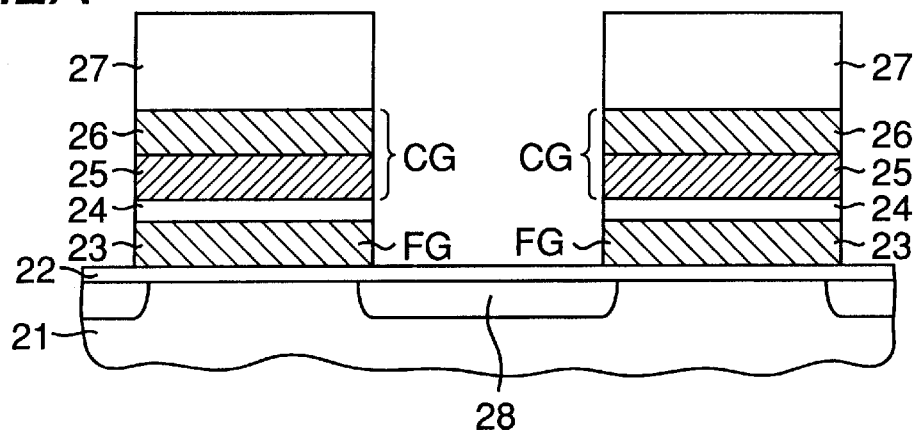
FIGS. 2A through 2G are step by step diagrams for explaining a fabricating method which represents a second embodiment of the invention as applied in fabricating a semiconductor memory transistor having floating gates.

First, as FIG. 2A shows, on a p-type silicon substrate (in an active region thereof) 21 having an isolation region (not shown) formed therein by the LOCOS (local oxidation) technique, for example, is formed a silicon oxide film 22 of 100 nm in thickness as a first gate insulating film by thermal oxidation, and then a polycrystal silicon film 23 of 100 nm in thickness to be used as material for a floating gate is deposited over the silicon oxide film 22. Subsequently, a photolithographic step is carried out to provide a resist (not shown) in a region to be formed into a floating gate, and reactive ion etching is carried out using the resist as a mask to remove the polycrystal silicon film 23. At this stage, the polycrystal silicon 23 remaining unremoved occupies a wider area than that shown.

Thereafter, on the remaining polycrystal silicon 23 is formed an ONO film (a three-layer film consisting of silicon oxide film/silicon nitride film/silicon oxide film) 24 which is to serve as a second gate insulating film, and then polycide films 25 and 26 which are to be used as control gate electrodes are sequentially deposited by the CVD technique over the ONO film 24. Further, in succession to the above, a silicon nitride film 27 of 150 nm in thickness is deposited by the CVD method over the polycide film 26. It is to be noted that the ONO film 24 is formed in such a way that after a silicon oxide film of 80 nm in thickness is formed on the surface of the polycrystal silicon film 23 by the thermal oxidation technique, a silicon nitride film of 20 nm in thickness and a silicon oxide film of 80 nm in thickness are sequentially deposited by the CVD method over the first mentioned silicon oxide film. The polycide films are a polycrystal silicon film 25 of 100 nm in thickness which is doped with phosphorus as an impurity and a tungsten silicide film 26 of 100 nm in thickness.

Subsequently, a photolithographic step is carried out to provide a resist (not shown) in a region to be formed into a control gate, and reactive ion etching is carried out using the resist as a mask to sequentially etch off silicon nitride film 27, tungsten silicide film 26, polycrystal silicon film 25, ONO film 24, and polycrystal silicon film 23. As a result, a control gate electrode CG and a floating gate electrode FG are formed in same region.

Then, after removal of the resist, an arsenic ion implantation is carried out at a dose of $4 \times 10^{15}/cm^2$ using the control gate electrode CG, etc. as masks thereby to form an N-type high density diffusion layer 28 which is to be formed into a source or drain region.

Figure 2B:
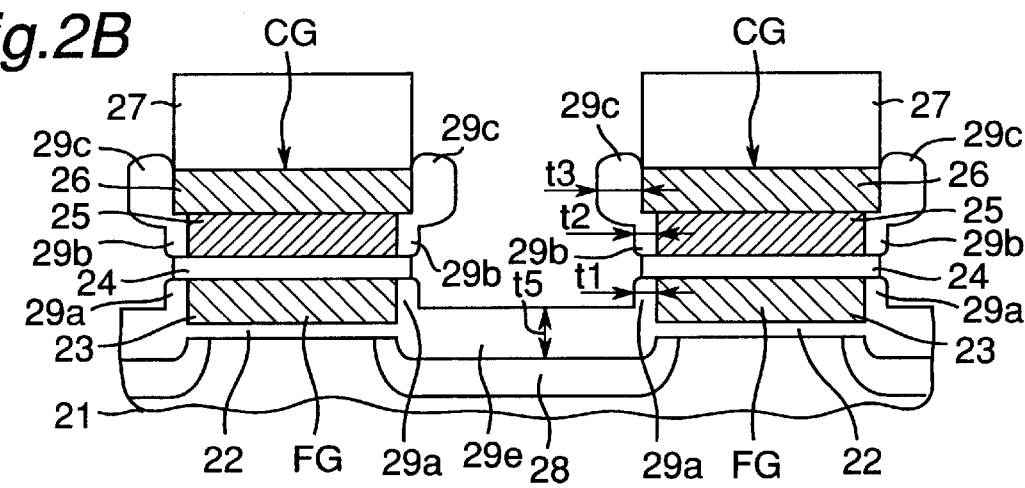

Next, as FIG. 2B shows, thermal oxidation is carried out in an oxygen atmosphere to form a silicon oxide film 29a on sides of the polycrystal silicon film 23 which constitutes a floating gate electrode FG, the silicon oxide film 29a having comparatively good electric insulation characteristics. The reason for forming the silicon oxide film 29a is that in a non-volatile memory transistor having a floating gate, wherein the state of the memory transistor as a memory element in writing and erasing is defined by the quantity of charge accumulated in the floating gate electrode FG, it is necessary to improve the insulating characteristic of the floating gate electrode FG. It is noted in the above connection that simultaneously with the formation of the silicon oxide film 29a on sides of the floating gate electrode FG are formed a silicon oxide film 29b on sides of the polycrystal silicon film 25 which is a constituent of the control gate electrode CG, and a silicon oxide film 29c on sides of the tungsten silicide 26. The surface side of the source/drain region 28 is oxidated and a silicon oxide film 29e is formed thereon in place of the first gate insulating film 22. In the present instance, where the thickness t1 of the silicon oxide film 29a is set to 50 nm for enabling the floating gate electrode FG to have good insulating property, the thickness t2 of the silicon oxide film 29b is 50 nm, the thickness t3 of the silicon oxide 29c is 100 nm, and the thickness t5 of the silicon oxide film 29e is 100 nm. The reason for t1<t5 is that the quantity of impurities injected into the source/drain region 28 is larger than the quantity of impurities injected into the floating gate electrode FG. When the polycrystal silicon film 25 is oxidated, the position of the film surface (an interface relative to the silicon oxide film 29b) is changed, whereas no changes occur in the surface position when the tungsten silicide film 26 is oxidated. Therefore, the upper portion 26 of the control gate electrode CG is larger in width than the lower portion 25 thereof. Furthermore, the thickness t3 of the silicon oxide film 29c is larger than the thickness t1, t2 of the silicon oxide films 29a, 29b. Therefore, the silicon oxide films 29a, 29b, 29c have an overhang configuration.

Figure 2C:
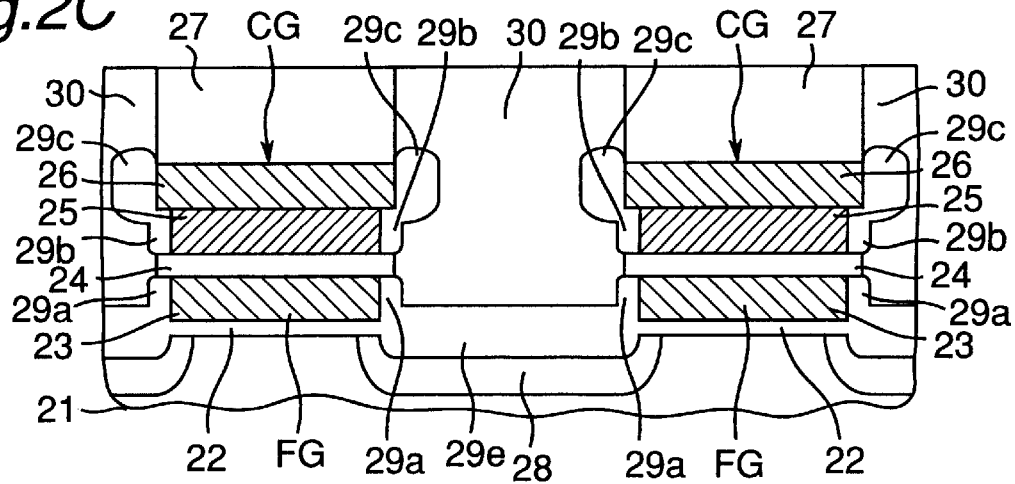

Next, as FIG. 2C shows, a silicon oxide film 30 of 1000 nm in thickness is deposited over the entire surface as an interlayer insulation film for electrically isolating the gate electrodes FG, CG from an overlying wiring (not shown), thereby filling the space between adjacent gate patterns CG, CG with the silicon oxide film 30. Then, the silicon oxide film 30 is polished to the surface level of the silicon nitride film 27 by a so-called CMP method.

Figure 2D:
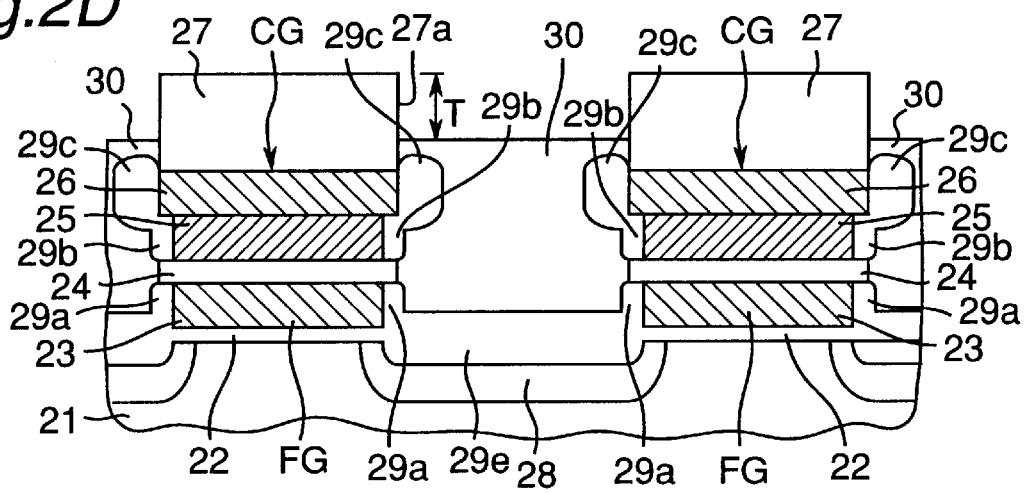

Then, as FIG. 2D shows, the silicon oxide film 30 is selectively etched in relation to the silicon nitride film 27 thereby to lower the surface level of the silicon oxide film 30, thus exposing an upper portion of a side 27a of the silicon nitride film 27. A side wall film 31 of 100 nm in thickness which is comprised of silicon nitride is formed on the exposed portion of the side 27a at a next stage. Generally, for the formation of a side wall film, a step higher than the thickness of the side wall film is required and, therefore, in the present instance the height T of the exposed portion of the side 27a is set at 175 nm.

Figure 2E:
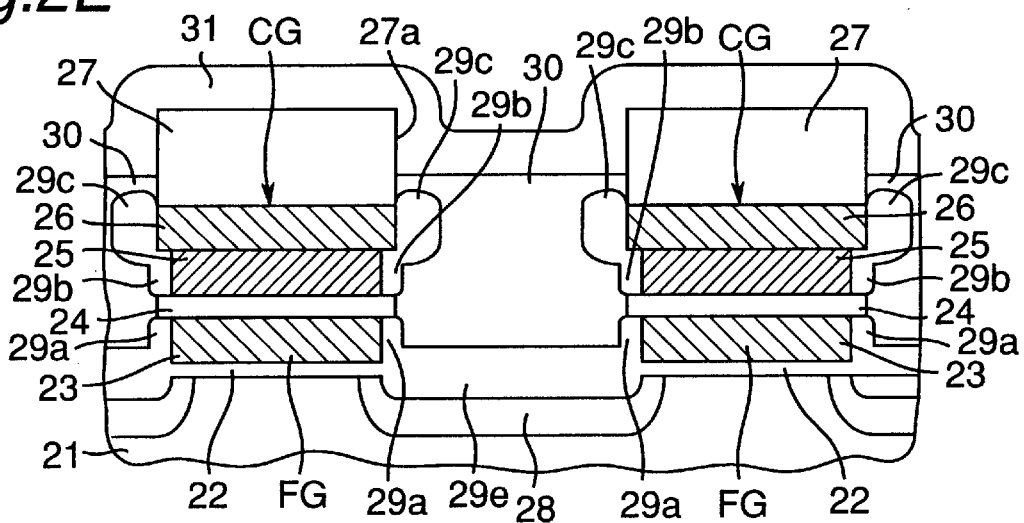
Figure 2F:
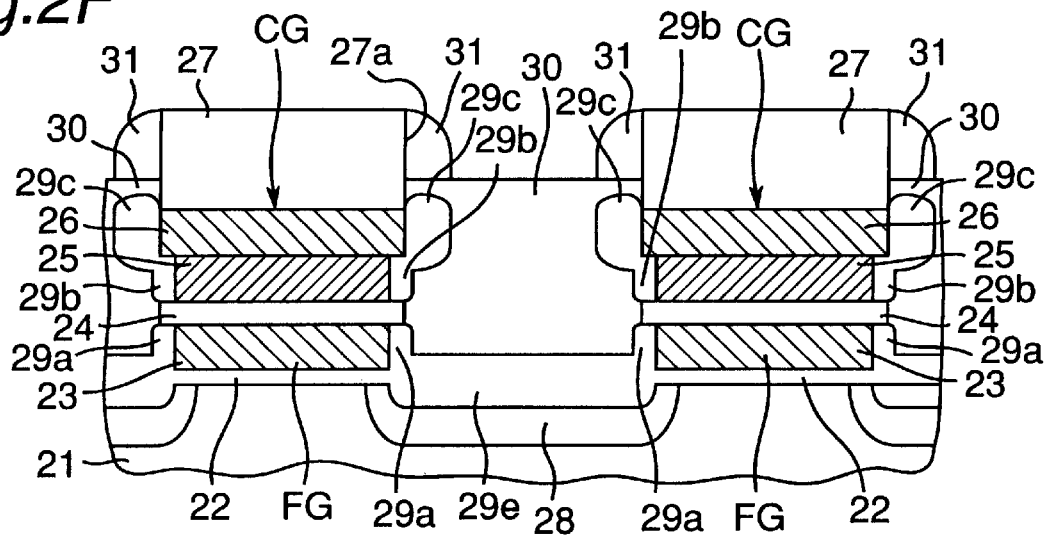

Next, after a silicon nitride film 31 is deposited to the thickness of 100 nm by using the CVD method over the entire surface as shown in FIG. 2E, anisotropic etch back is carried out to form a side wall film (for simplicity, to be designated hereinafter by the same reference numeral as silicon nitride film 31) comprised of silicon nitride on the exposed portion of the side 27a of the silicon nitride film 27 as shown in FIG. 2F. The side wall film 31 is intended to electrically insulate the gate electrodes FG, CG from the overlying wiring (not shown) and is set to the thickness of 100 nm (shown widthwise) as earlier mentioned.

Figure 2G:
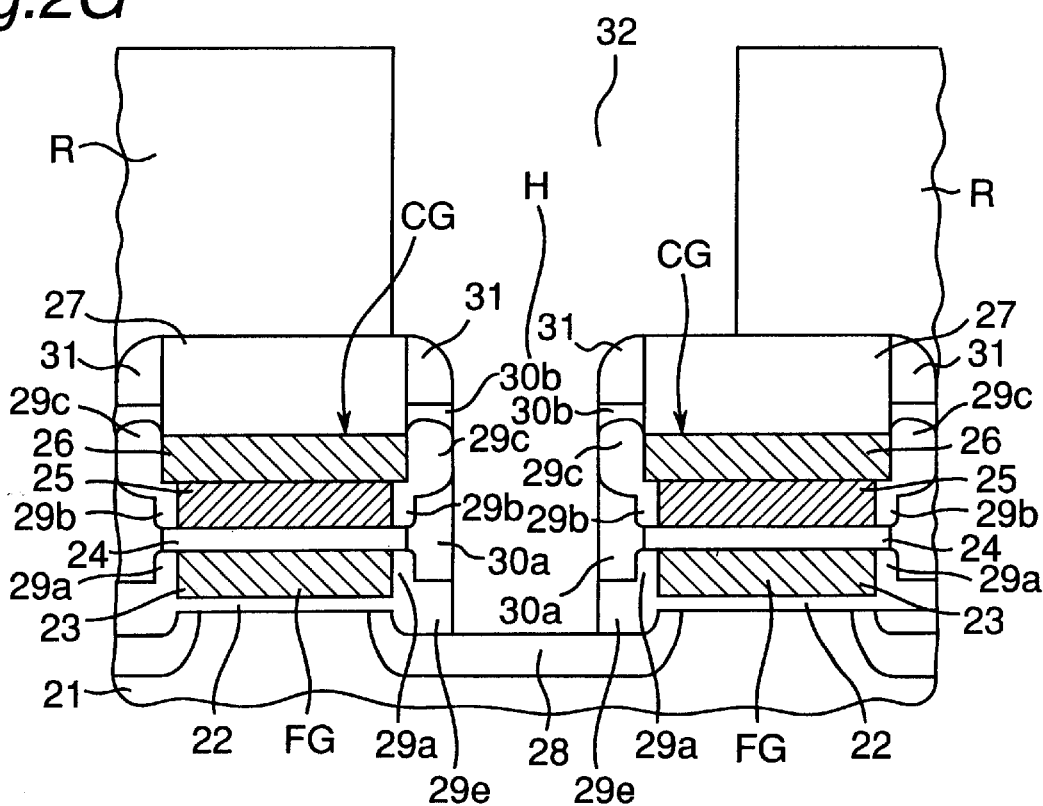

Next, as FIG. 2G shows, a photolithographic step is carried out to form a resist R having an opening 32 on the silicon nitride 27 for use as a mask for forming a contact hole.

Subsequently, etching is carried out using the resist R, silicon nitride film 27, and side wall films 31 as masks to selectively remove silicon oxide film 30, and further the silicon oxide film 29 above the source/drain region 28 is etched off. A portion 30b of the silicon oxide film 30 remains unremoved between the upper and lower side wall films 31 and 29c, and another portion 30a of the silicon oxide 30 remains unremoved between the silicon oxide films 29c and 29e. In this way, a contact hole H is formed in a self-aligned manner in a region corresponding to a space between the opposed side wall films 31, 29c; 31, 29c. The contact hole H extends from the surface side of the interlayer insulation film 30 through to the surface of the source/drain region 28.

Thus, the size of the contact hole H is such that it is reduced only by a portion corresponding to the thickness of the opposed side wall films 31, 31 in relation to the distance between adjacent gate electrodes FG, CG; FG, CG. Therefore, the allowance for the distance between the gate electrodes FG, CG and the contact hole H can be reduced as compared with the allowance required in the prior art. This facilitates the realization of a micro-fine patterning. Furthermore, there is no possibility of gate electrode material 24, 25 or 26 being exposed in the hole H, nor is there any possibility of short-circuit between the overlying wiring and the gate electrodes FG or CG.

(Third Embodiment)

Referring to FIGS. 3A through 3F, there is shown one embodiment wherein a MOS transistor is an ordinary MOS transistor having no LDD (lightly doped drain) structure. For brevity, the same components as those in FIGS. 1A through 1H are designated by similar reference numerals.

Figure 3A:
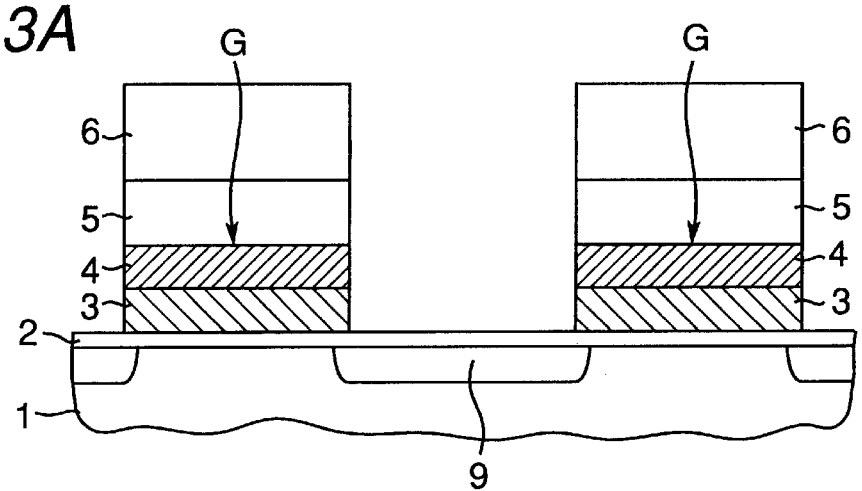
FIGS. 3A through 3F are step by step diagrams for explaining a fabricating method which represents a third embodiment of the invention as applied in fabricating an ordinary MOS transistor.

First, as FIG. 3A shows, on a p-type silicon substrate (in an active region thereof) 1 having an isolation region (not shown) formed therein by the LOCOS (local oxidation) technique, for example, is formed a silicon oxide film 2 of 10 nm in thickness as a gate insulating film by thermal oxidation, and polycide films 3 and 4 to be made into gate electrodes are sequentially deposited one over the other by the CVD (chemical vapor deposition) technique, and then a silicon oxide film 5 of 150 nm in thickness and a silicon nitride film 6 of 200 nm in thickness are sequentially deposited by the CVD technique over the polycide film 4. The polycide films 3, 4 are a polycrystal silicon film 3 of 100 nm in thickness which is doped with phosphorus as an impurity and a tungsten silicide film 4 of 100 nm in thickness.

Subsequently, a photolithographic step is carried out to provide a resist (not shown) in a region to be formed into a gate of the MOS transistor, and reactive ion etching is carried out using the resist as a mask to remove part of each of silicon nitride film 6, silicon oxide film 5, tungsten silicide film 4, and polycrystal silicon film 3. As a result, gate electrodes G comprised of tungsten silicide film 4 and polycrystal silicon film 3 are formed as such. After removal of the resist, an arsenic ion implantation is carried out at a dose of $1 \times 10^{15}/cm^2$ utilizing the silicon nitride film 6, silicon oxide film 5, and gate electrode G as masks to form an N-type high-density diffusion layer 9 which is to act as a source and a drain region.

Figure 3B:
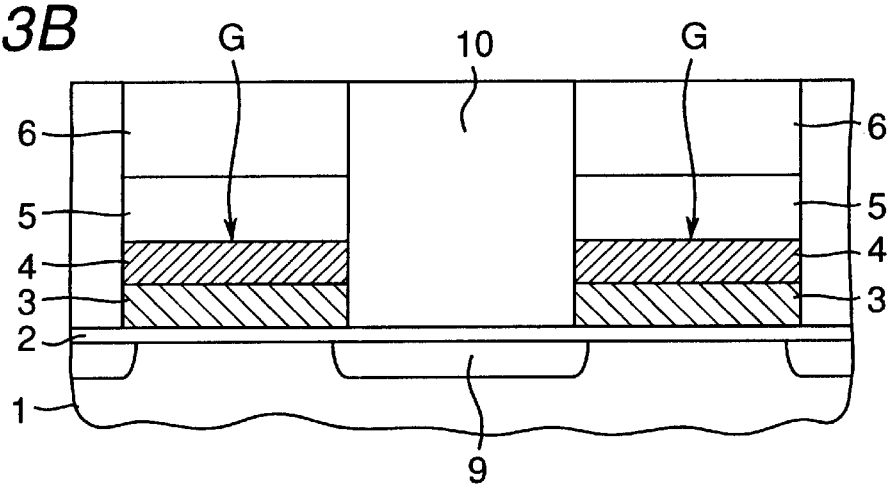

Next, as FIG. 3B shows, a silicon oxide film 10 of 1000 nm in thickness is deposited over the entire surface as an interlayer insulation film for electrically isolating the gate electrodes G from an overlying wiring (not shown), thereby filling the space between adjacent gate patterns G, G with the silicon oxide. Then, the silicon oxide film 10 is polished to the surface level of the silicon nitride film 6 by the so-called CMP method.

Figure 3C:
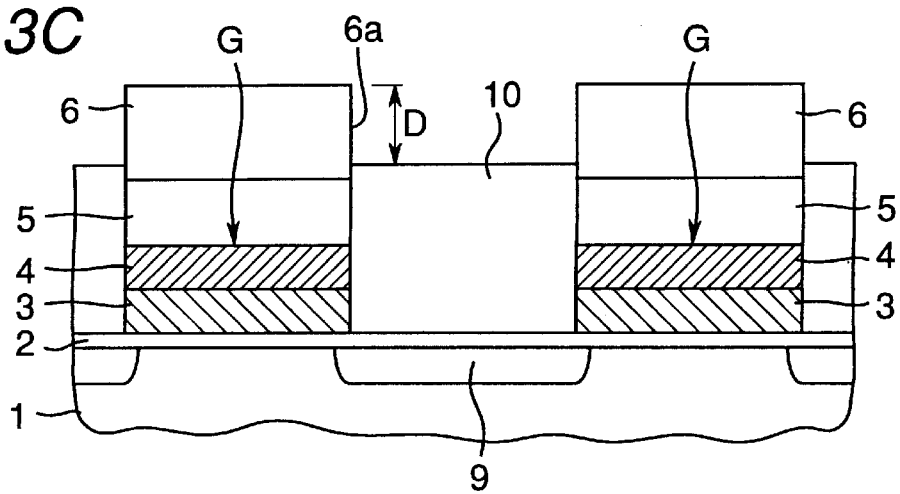

Then, the silicon oxide film 10 is selectively etched in relation to the silicon nitride film 6 thereby to lower the surface level of the silicon oxide film 10, thus exposing an upper portion of a side 6a of the silicon nitride film 6, as shown in FIG. 3C. A side wall film 11(see FIG. 3D) of 100 nm in thickness which is comprised of silicon nitride is formed on the exposed portion of the side 6a at a next stage. Generally, for the formation of a side wall film, a step higher than the thickness of the side wall film is required and, therefore, in the present instance the height D of the exposed portion of the side 6a is set at 175 nm.

Figure 3D:
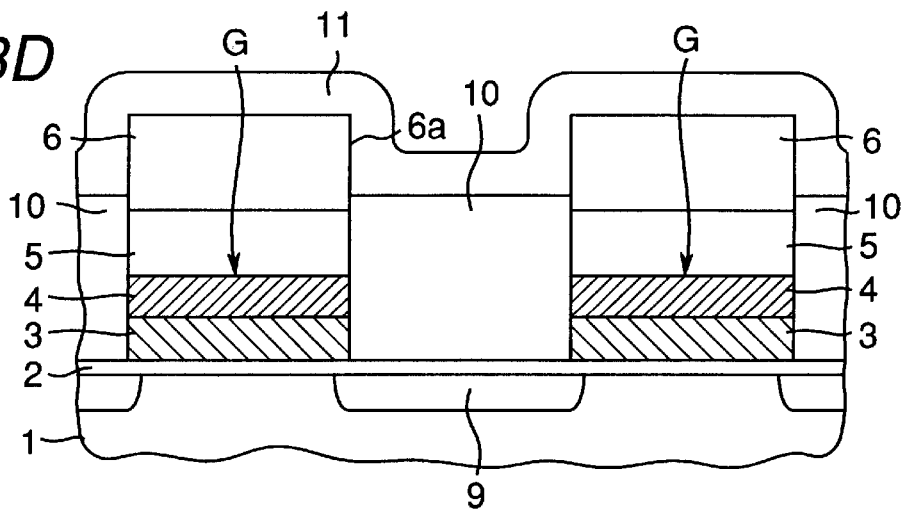
Figure 3E:
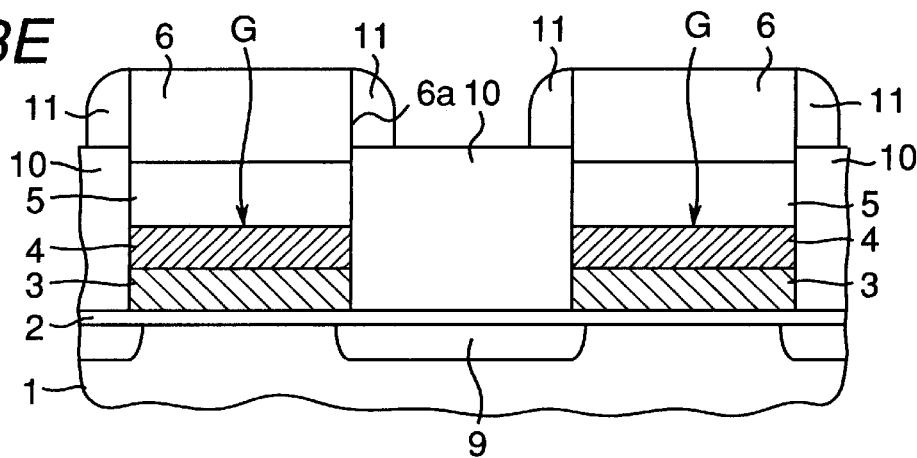

Next, as shown in FIG. 3D, after a silicon nitride film 11 is deposited to the thickness of 100 nm by using the CVD method over the entire surface, as shown in FIG. 3E, anisotropic etch back is carried out to form a side wall film (for simplicity, to be designated hereinafter by the same reference numeral as silicon nitride film 11) comprised of silicon nitride on the exposed portion of the side 6a of the silicon nitride film 6. The side wall film 11 is intended to electrically insulate the gate electrodes G from the overlying wiring not shown and is set to the thickness of 100 nm (shown widthwise) as earlier mentioned.

Figure 3F:
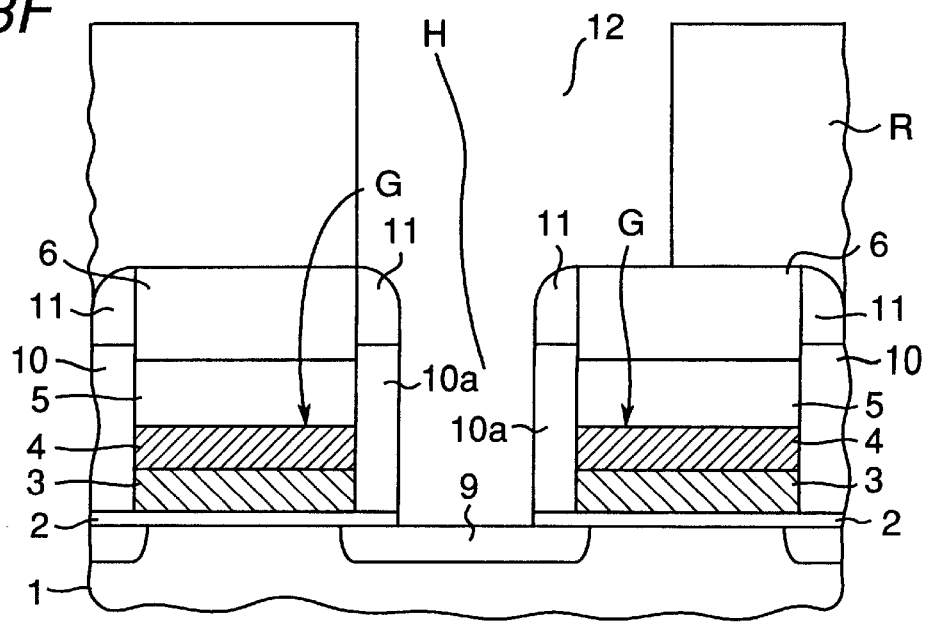
Figure 4A:
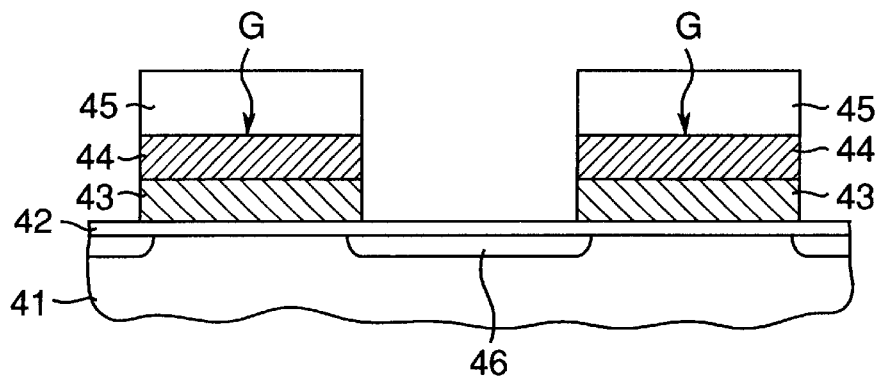
FIGS. 4A through 4G are step by step diagrams for explaining a conventional method of fabricating an MOS transistor having an LDD structure.
Figure 4B:
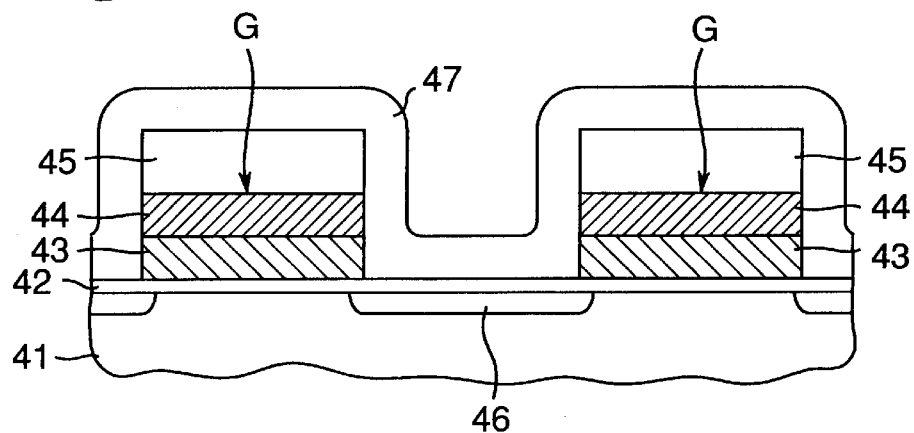
Figure 4C:
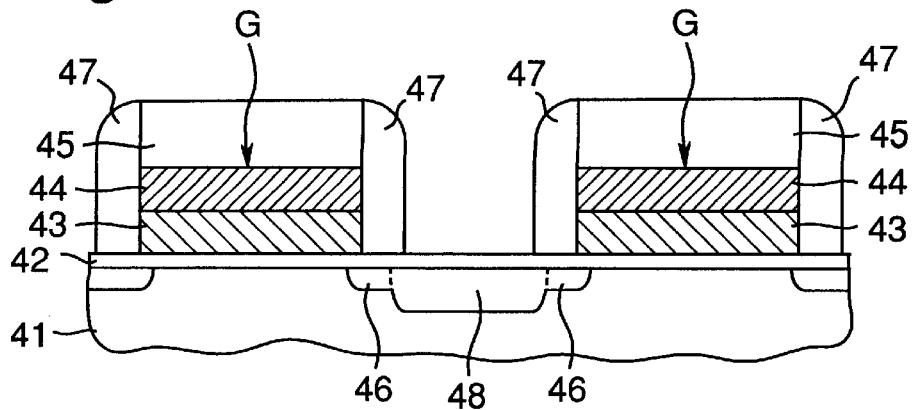
Figure 4D:
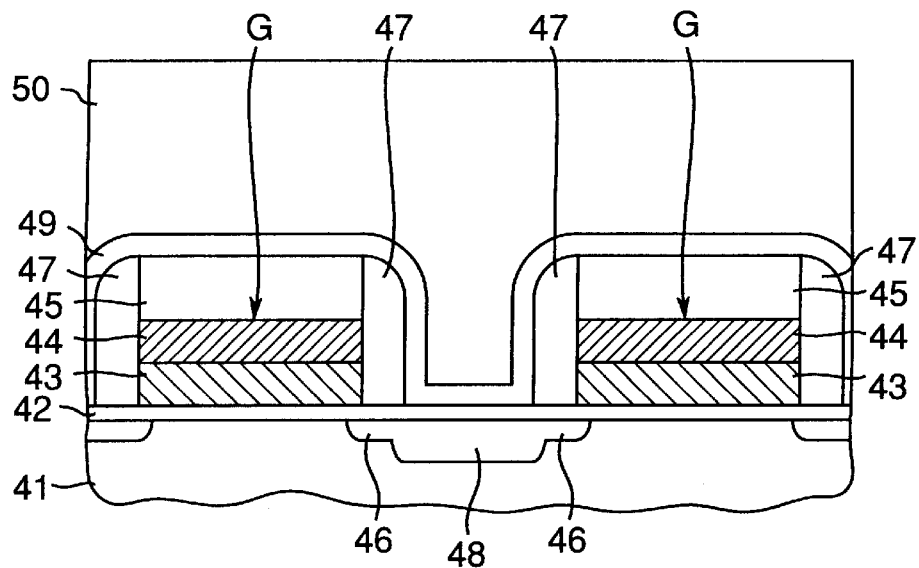
Figure 4E:
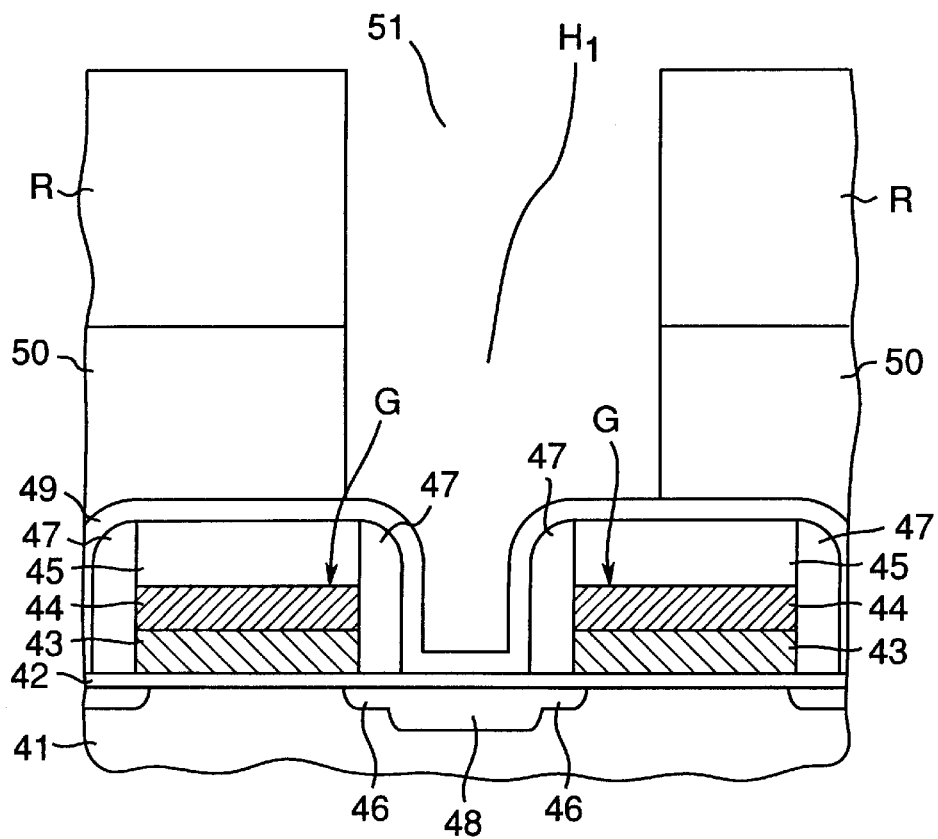
Figure 4F:
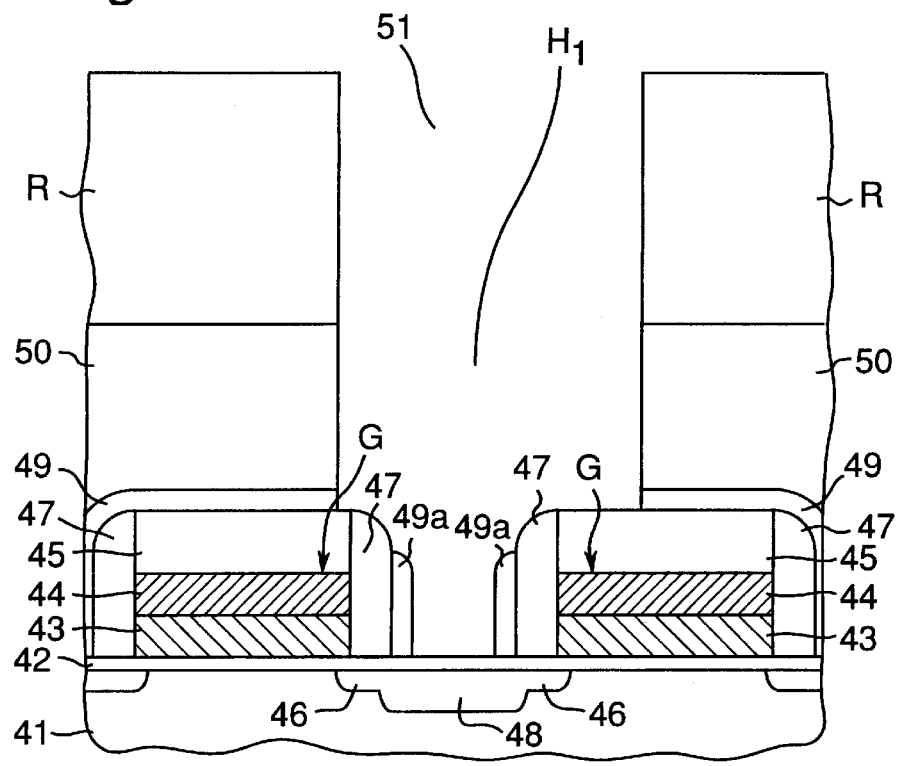
Figure 4G:
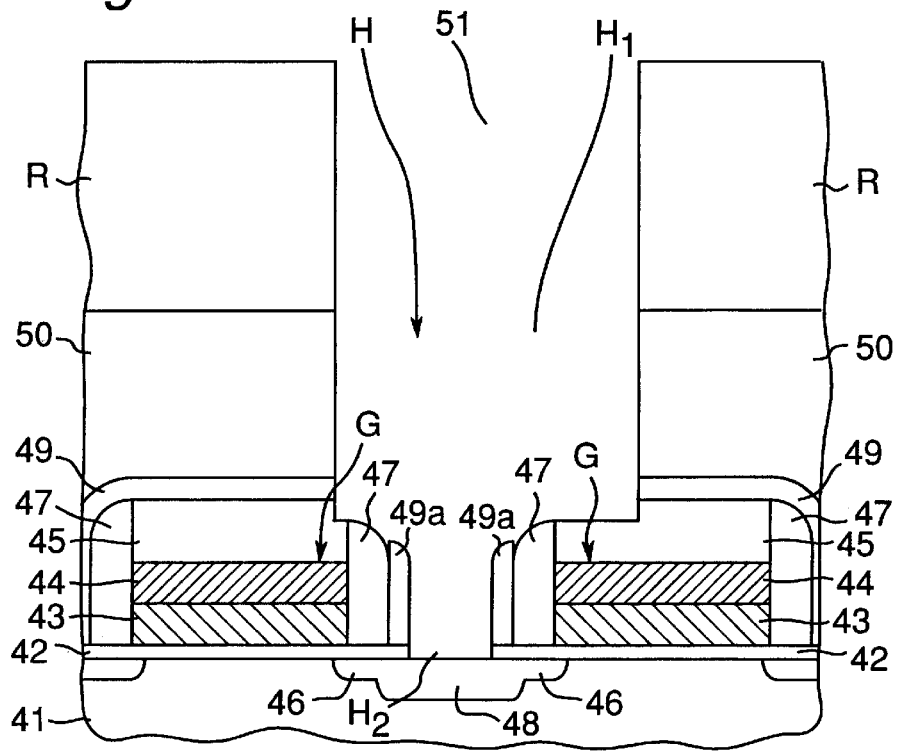
Figure 5A:
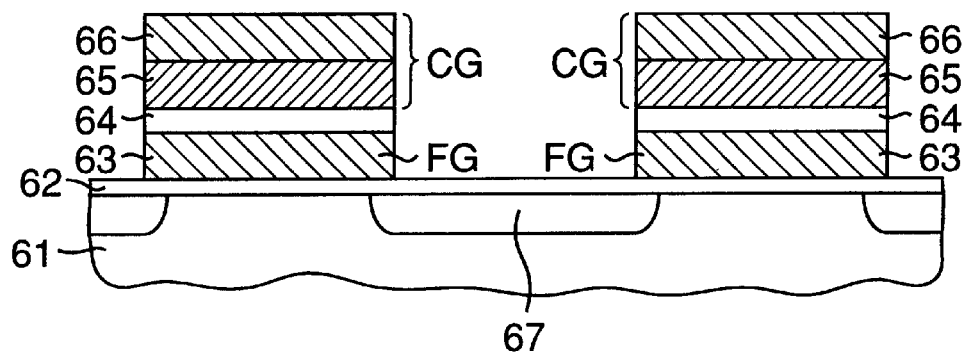
FIGS. 5A through 5F are step by step diagrams for explaining a conventional method of fabricating a semiconductor memory transistor having a floating gate.
Figure 5B:
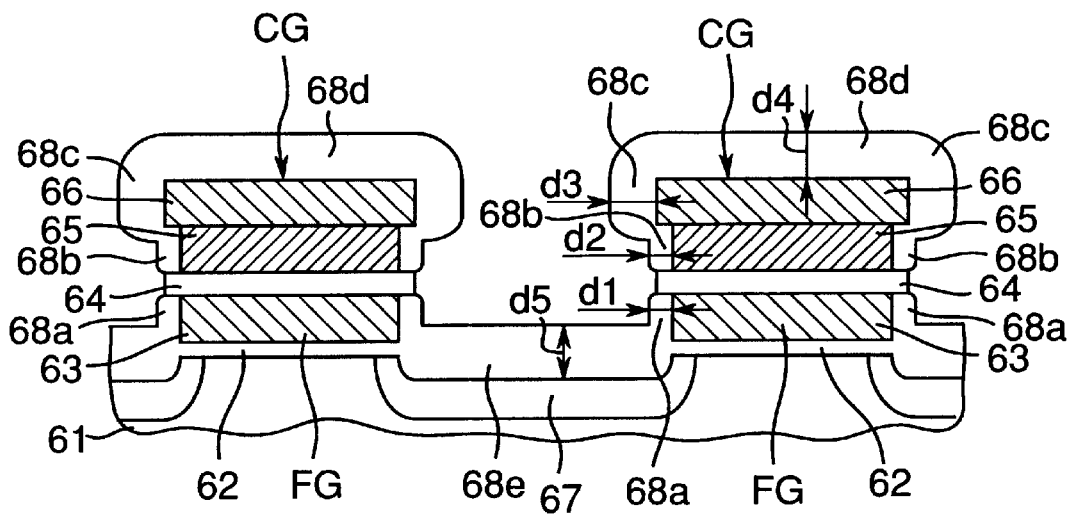
Figure 5C:
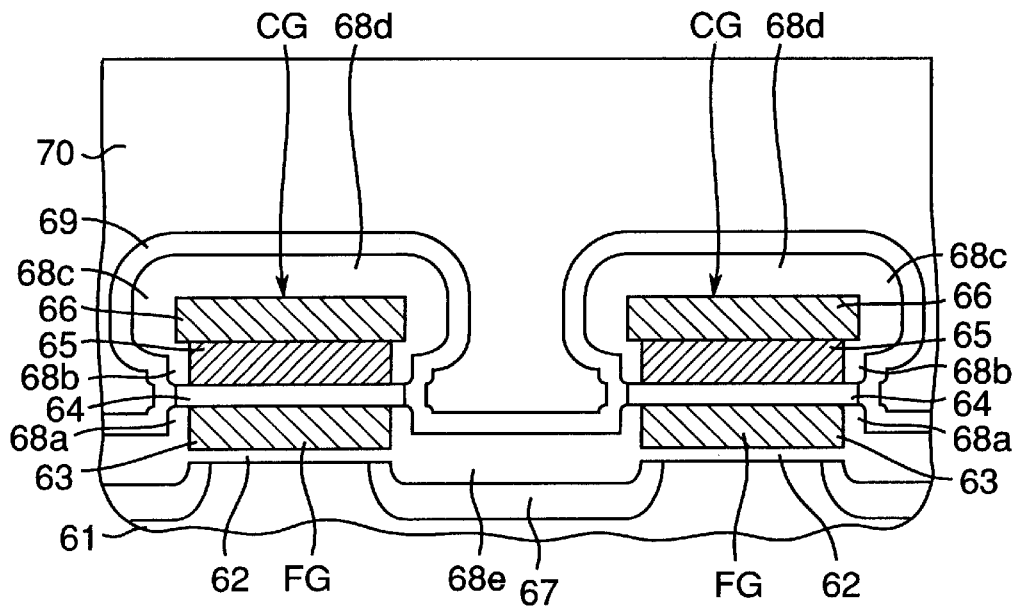
Figure 5D:
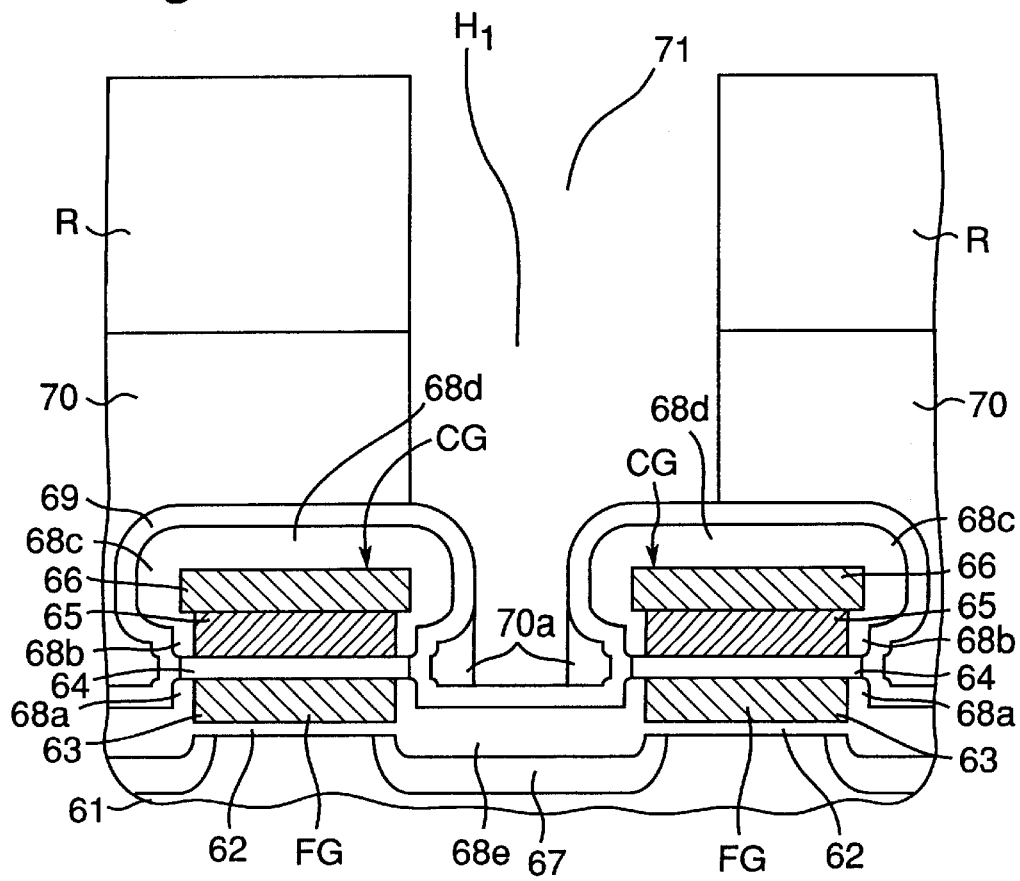
Figure 5E:
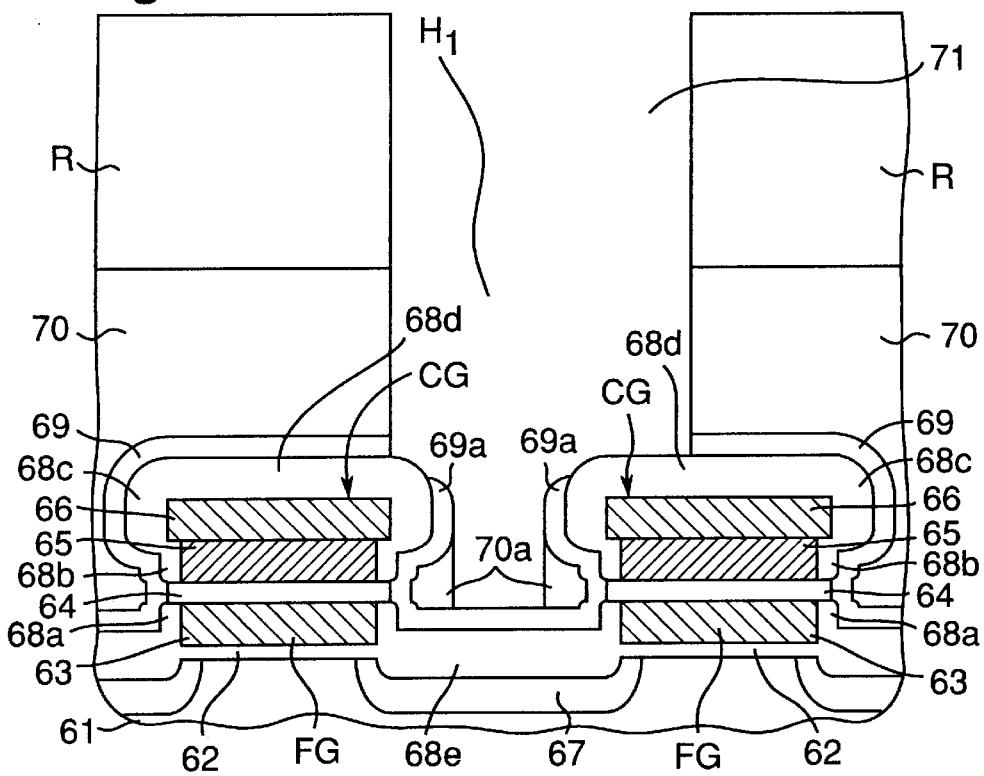
Figure 5F:
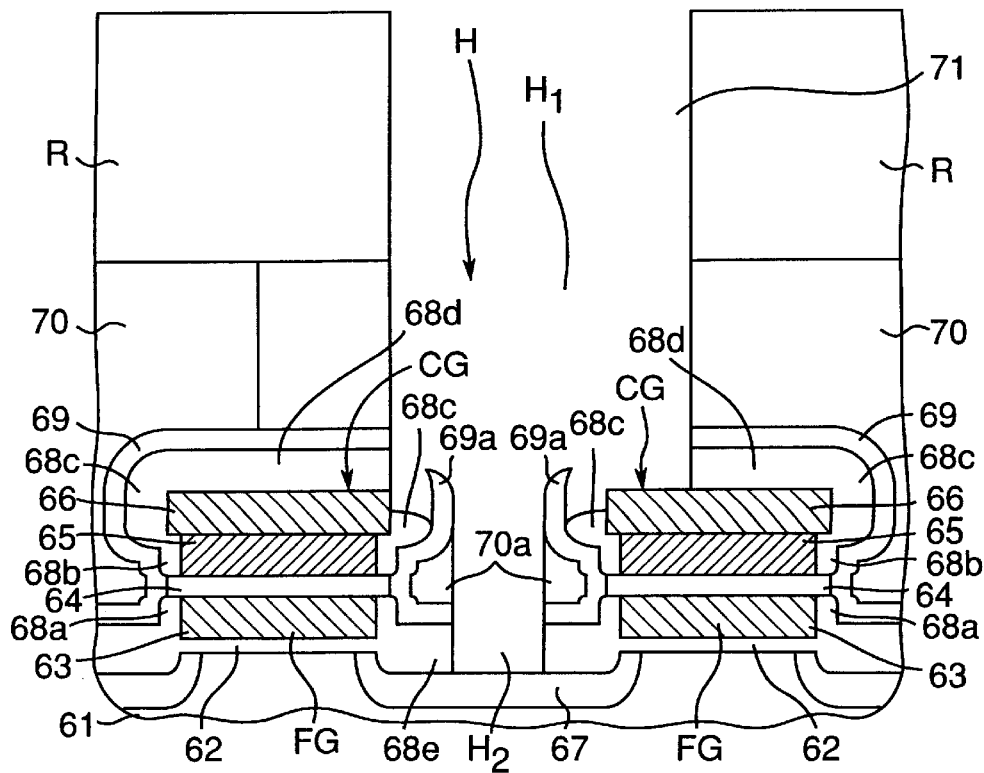

Next, as FIG. 3F shows, a photolithographic step is carried out to form a resist R having an opening 12 on the silicon nitride film 6 for use as a mask for forming a contact hole. The size of the opening 12 of the resist R (dimensions within planes parallel to the substrate) contains opposed side walls of adjacent gate electrodes G, G and also contains part of the gate electrodes G by way of allowance.

Subsequently, etching is carried out using the resist R, silicon nitride film 6, and side wall films 11 as masks to selectively remove most part of silicon oxide film 10, and further the silicon oxide film 2 above the source/drain region 9 is etched off. A portion 10a of the silicon oxide film 10 remains unremoved under the side wall film 11. In this way, a contact hole H is formed in a self-aligned manner in a region corresponding to a space between the opposed side walls 11, 10a and 11, 10a. The contact hole H extends from the surface side of the interlayer insulation film 10 through to the surface of the source/drain region 9.

Thus, the size of the contact hole H is such that it is reduced only by a portion corresponding to the thickness of the opposed side wall films 11, 11 in relation to the distance between adjacent gate electrodes G, G. Therefore, the allowance for the distance between the gate electrodes G and the contact hole H can be reduced as compared with the allowance required in the prior art. This facilitates the realization of a micro-fine patterning In the foregoing embodiments, silicon nitride film 6 or 27 is used as a mask insulating film. It is to be noted, however, that where alumina $Al_2O_3$ is used in place of silicon nitride, it is also possible to form the contact hole H in the same way and with the same effect as above described.

As is apparent from the above description, according to the semiconductor device fabricating method of the invention, the contact hole is formed by selectively etching the interlayer insulation film in relation to the mask insulating film and the side wall film so that the contact hole is formed in self-aligned relation to the gate electrodes. Furthermore, the size of the contact hole is such that it is reduced only by a portion corresponding to the thickness of the opposed side wall films in relation to the distance between adjacent gate electrodes. It is only required, therefore, that less allowance be considered with respect to the distance between the gate electrodes and the contact hole as compared with the allowance required in the prior art. This facilitates the realization of a micro-fine patterning.

In the semiconductor device fabricating method according to an embodiment of the invention, when fabricating a MOS transistor having an LDD structure, the contact hole is formed in self-aligned relation to the gate electrodes. Further, the size of the contact hole is such that it is reduced only by a portion corresponding to the thickness of the opposed side wall films in relation to the distance between adjacent gate electrodes. Therefore, the allowance for the distance between the gate electrodes and the contact hole can be reduced as compared with the allowance required in the prior art. This facilitates the realization of a micro-fine patterning.

Also, according to the semiconductor device fabricating method of the present invention, when fabricating a semiconductor memory transistor having a floating gate, the contact hole is formed by selectively etching the interlayer insulation film relative to the mask insulating film and the side wall films so that the contact hole is formed in self-aligned relation to the gate electrodes (floating gate electrode and control gate electrode). Further, the size of the contact hole is such that it is reduced only by a portion corresponding to the thickness of the opposed side wall films in relation to the distance between adjacent gate electrodes. Thus, it is only required that less allowance be considered with respect to the distance between the gate electrodes and the contact hole as compared with the allowance required in the prior art. This facilitates the realization of a micro-fine patterning. Furthermore, the method involves no possibility of the gate electrode material being exposed within the contact hole, and there is no possibility either of short-circuit between the overlying wiring and the gate electrodes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a semiconductor device wherein a contact hole is formed in self-aligned relation to gate electrodes, the method comprising:

forming on a surface of a semiconductor substrate a gate insulating film, a conductive film, and a mask insulating film which is to be used as material for an etching mask, by sequentially placing them one over another;

processing the mask insulating film and the conductive film on the semiconductor substrate into a gate electrode pattern comprising a plurality of spaced-apart gate electrode structures having gate electrodes comprised of the conductive film;

depositing on the semiconductor substrate an interlayer insulation film comprised of a material which is selectively etched in relation to the mask insulating film, thereby filling a space between adjacent gate electrode structures with the interlayer insulation film;

selectively etching the interlayer insulation film by using the mask insulating film as an etching mask to lower a surface level of the interlayer insulation film between the adjacent gate electrode structures, thereby exposing opposed sides of the mask insulating film at least in part;

forming side wall films comprised of a material to which the interlayer insulation film is selectively etched on the opposed sides of the mask insulating film exposed by the selective etching of the interlayer insulation film, said side wall films extending to an upper surface of the lowered interlayer insulation film; and selectively etching the interlayer insulation film by using the mask insulating film and the side wall films as an etching mask to remove a portion of the interlayer insulation film which corresponds to a space between the side wall films formed on the opposed sides of the mask insulating film, thereby forming the contact hole extending to a diffusion region formed on the surface of the semiconductor substrate.

2. A method of fabricating a semiconductor device as defined in claim 1, further comprising, after formation of the gate electrode structures and before deposition of the interlayer insulation film:

carrying out ion implantation using the mask insulating film and the gate electrodes as masks to form a low density diffusion region in a region corresponding to a space between the gate electrode structures adjacent to one another on the semiconductor substrate;

forming side wall spacers on sides of the gate electrodes; and carrying out ion implantation using the mask insulating film, the gate electrodes, and the side wall spacers as masks to form a high density diffusion region in a region corresponding to an interior side of the low density diffusion region as viewed in a direction parallel to the surface of the semiconductor substrate.

3. A method of fabricating a semiconductor device wherein a contact hole is formed in self-aligned relation to gate electrodes, the method comprising:

forming on a surface of a semiconductor substrate a first gate insulating film, a first conductive film, a second gate insulating film, a second conductive film, and a mask insulating film which is to be used as material for an etching mask, by sequentially placing them one over another;

processing the mask insulating film, the second conductive film, the second gate insulating film, the first conductive film, and the first gate insulating film on the semiconductor substrate into a gate electrode pattern comprising a plurality of spaced-apart gate electrode structures having floating gate electrodes comprised of the first conductive film and control gate electrodes comprised of the second conductive film;

carrying out ion implantation using at least the mask insulating film as a mask to form a diffusion region in a region corresponding to the space between the gate electrode structures adjacent to one another on the surface of the semiconductor substrate;

forming thermal oxide films by thermal oxidation on respective sides of the floating gate electrodes and the control gate electrodes;

depositing on the semiconductor substrate an interlayer insulation film comprised of a material which is selectively etched in relating to the mask insulating film, thereby filling a space between the adjacent gate electrode structures with the interlayer insulation film;

selectively etching the interlayer insulation film by using the mask insulating film as an etching mask to lower a surface level of the interlayer insulation film between the adjacent gate electrode structures, thereby exposing opposed sides of the mask insulating film at least in part;

forming side wall films comprised of a material to which the interlayer insulation film can be selectively etched on the opposed sides of the mask insulating film exposed by the selective etching of the interlayer insulation film, said side wall films extending to an upper surface of the lowered interlayer insulation film; and selectively etching the interlayer insulation film by using the mask insulating film as an etching mask and the side wall films to remove a portion of the interlayer insulation film which corresponds to a space between the side wall films formed on the opposed sides of the mask insulating film, thereby forming the contact hole extending to the diffusion region.

4. A method of forming a contact hole between spaced-apart gate electrode structures formed on a substrate, each said gate electrode structure comprising an electrode and a mask film formed on said electrode, the method comprising:

forming an insulating film that fills in a space between said spaced-apart gate electrode structures;

partially etching said insulating film in the space between said spaced-apart gate electrode structures using said mask films of said gate electrode structures as an etching mask to lower a surface of said insulating film in the space between said spaced-apart gate electrode structures, thereby exposing opposed side wall portions of the mask films at least in part;

forming side wall films on the opposed side wall portions of said mask films that are exposed by partially etching said insulating film, said side wall films extending to an upper surface of the lower insulating film; and further etching said insulating film in the space between said spaced-apart gate electrode structures using said mask films and said side wall films as an etching mask to form a contact hole, wherein a portion of the substrate is exposed.

5. A method as defined in claim 4, wherein each said gate electrode structure comprises another electrode insulated from the electrode on which said mask film is formed.

6. A method as defined in claim 4, further comprising:

prior to depositing an insulating film that fills in the space between said spaced-apart gate electrode structures, implanting impurities into said substrate using said gate electrode structures as a mask to form a diffusion region in a portion of said substrate corresponding to the space between said spaced-apart gate electrode structures, wherein the further etching of said insulating film at least partially exposes said diffusion region.

7. A method as defined in claim 4, wherein said mask films comprise silicon nitride, said insulating film comprises silicon oxide, and said side wall films comprise silicon nitride.

8. A method as defined in claim 4, wherein the step of forming side wall films comprises:

forming a film that covers upper surfaces of said mask films, an upper surface of said insulating film and said opposed side wall portions of said mask films that are exposed by partially etching said insulating film; and selectively etching said film so that only portions of said film on said opposed side wall portions of said mask films remain.

9. A method as defined in claim 4, wherein said gate electrode structures are parts of nonvolatile memory cell transistors.

10. A method as defined in claim 4, wherein said gate electrode structures are parts of MOS transistors.

11. A method as defined in claim 4, wherein each said gate electrode structure further comprises side wall spacers.

12. A method as defined in claim 4, further comprising:

prior to depositing an insulating film that fills in the space between said spaced-apart gate electrode structures, implanting impurities into said substrate at least twice to form a diffusion region having an LDD structure in a portion of said substrate corresponding to the space between said spaced-apart gate electrode structures, wherein the further etching of said insulating film at least partially exposes said diffusion region.

* * * * *